(12) United States Patent
Revier et al.

(10) Patent No.: US 11,865,773 B2
(45) Date of Patent: Jan. 9, 2024

(54) ADDITIVE PROCESS FOR CIRCULAR PRINTING OF ELECTRONIC DEVICES

(71) Applicant: Texas Instruments Incorporated, Dallas, TX (US)

(72) Inventors: Daniel Lee Revier, Seattle, WA (US); Sean Ping Chang, Richardson, TX (US); Benjamin Stassen Cook, Los Gatos, CA (US)

(73) Assignee: Texas Instruments Incorporated, Dallas, TX (US)

( * ) Notice: Subject to any disclaimer, the term of this patent is extended or adjusted under 35 U.S.C. 154(b) by 844 days.

(21) Appl. No.: 16/680,153

(22) Filed: Nov. 11, 2019

(65) Prior Publication Data

US 2021/0138727 A1   May 13, 2021

(51) Int. Cl.
*B29C 64/165* (2017.01)
*B33Y 80/00* (2015.01)
(Continued)

(52) U.S. Cl.
CPC ............ *B29C 64/165* (2017.08); *B22F 10/00* (2021.01); *B22F 10/14* (2021.01); *B22F 12/37* (2021.01); *B22F 12/53* (2021.01); *B22F 12/55* (2021.01); *B22F 12/57* (2021.01); *B28B 1/001* (2013.01); *B33Y 10/00* (2014.12); *B33Y 30/00* (2014.12); *B33Y 70/00* (2014.12); *B33Y 80/00* (2014.12); *H01L 21/0217* (2013.01);
(Continued)

(58) Field of Classification Search
CPC ... B29C 64/165; B29C 64/112; B29C 64/241; B22F 10/00; B22F 12/41; B22F 12/49; B22F 2999/00; B22F 10/14; B22F 12/53; B22F 12/37; B22F 12/226; B22F 12/55; B22F 12/57; B28B 1/001; B33Y 10/00; B33Y 30/00; B33Y 70/00; B33Y 80/00; H01L 21/02164; H01L 21/0217; H01L 21/02288; H01L 21/02532; H01L 21/02595; H01L 21/02623; H01L 21/288; H01L 21/6715; B29L 2031/34; C04B 35/14; C04B 35/584; C04B 2235/6026; Y02P 10/25
USPC ...................................................... 700/119
See application file for complete search history.

(56) References Cited

U.S. PATENT DOCUMENTS 6,786,563 B1   9/2004   Jones
7,850,276 B2   12/2010  Lugaresi et al.
(Continued)

*Primary Examiner* — Michael J Brown
(74) *Attorney, Agent, or Firm* — Andrew R. Ralston; Frank D. Cimino

(57) ABSTRACT

A layer of additive material is formed in a circular printing area on a substrate using additive sources distributed across a printing zone. The additive sources form predetermined discrete amounts of the additive material. The substrate and the additive sources are rotated with respect to each other around a center of rotation, so that a pattern of the additive material is formed in a circular printing area on the substrate. Each additive source receives actuation waveforms at an actuation frequency that is proportional to a distance of the additive source from the center of rotation. The actuation waveforms include formation signals, with a maximum of one formation signal in each cycle of the actuation frequency. The formation signals result in the additive sources forming the predetermined discrete amounts of the additive material on the substrate.

24 Claims, 8 Drawing Sheets

(51) Int. Cl.

| | |
|---|---|
| *B33Y 10/00* | (2015.01) |
| *B33Y 70/00* | (2020.01) |
| *B33Y 30/00* | (2015.01) |
| *B28B 1/00* | (2006.01) |
| *H01L 21/02* | (2006.01) |
| *H01L 21/288* | (2006.01) |
| *H01L 21/67* | (2006.01) |
| *B22F 10/00* | (2021.01) |
| *B22F 10/14* | (2021.01) |
| *B22F 12/37* | (2021.01) |
| *B22F 12/53* | (2021.01) |
| *B22F 12/55* | (2021.01) |
| *B22F 12/57* | (2021.01) |
| *B22F 12/41* | (2021.01) |
| *B29L 31/34* | (2006.01) |
| *B22F 12/00* | (2021.01) |
| *B22F 12/49* | (2021.01) |

(52) U.S. Cl.
CPC .. *H01L 21/02164* (2013.01); *H01L 21/02288* (2013.01); *H01L 21/02532* (2013.01); *H01L 21/02595* (2013.01); *H01L 21/02623* (2013.01); *H01L 21/288* (2013.01); *H01L 21/6715* (2013.01); *B22F 12/226* (2021.01); *B22F 12/41* (2021.01); *B22F 12/49* (2021.01); *B29L 2031/34* (2013.01)

(56) References Cited

U.S. PATENT DOCUMENTS

| | | |
|---|---|---|
| 2006/0209102 A1 | 9/2006 | Jones et al. |
| 2008/0260283 A1* | 10/2008 | Ivansen ............... B82Y 40/00 382/266 |
| 2017/0173886 A1* | 6/2017 | Menchik ............... B29C 64/112 |

\* cited by examiner

ADDITIVE PROCESS FOR CIRCULAR PRINTING OF ELECTRONIC DEVICES

FIELD

This disclosure relates to the field of additive processing. More particularly, but not exclusively, this disclosure relates to forming patterns by additive processing in circular paths or tracks.

BACKGROUND

Additive manufacturing covers a variety of processes, including material jetting, laser polymerization, and binder jetting. To speed fabrication, additive manufacturing machines may have multiple additive sources, such as material jetting heads or photonic polymerization heads, that may operate in parallel. The multiple additive sources are typically scanned over the part being formed in a parallel pattern, with each additive source operating as needed to produce successive layers of the part.

SUMMARY

The present disclosure introduces a system and a method for forming a layer of additive material within a circular printing area using an additive manufacturing process. In one implementation, the disclosed method involves providing additive sources distributed across a printing zone. The additive sources are configured for actuation for forming discrete, or quantized, amounts of additive material on a substrate. The substrate and the additive sources are rotated with respect to each other around a center of rotation, while the additive sources are actuated, so that a layer of the additive material is formed within a circular printing area on the substrate. A first end of the printing zone extends toward, or to, the center of rotation, and a second end of the printing zone extends toward, or to, a perimeter of the circular printing area. Each additive source receives formation signals, which result in the additive sites forming one of the discrete amounts of the additive material on the substrate for each formation signal. The formation signals are provided to the additive sites in periods of an actuation frequency, with either one formation signal or no formation signal in each period of the actuation frequency. The actuation frequency is proportional to a distance of the additive source from the center of rotation, which may provide improved coverage uniformity for the layer of the additive material compared to actuating all the additive sources at a single frequency.

In one manifestation, the disclosed system includes an additive process machine having a plurality of additive sources distributed across a printing zone. The additive sources are configured for actuation for forming a predetermined discrete amount of additive material on a substrate. The additive process machine includes a pattern generation circuit configured to provide actuation waveforms to the additive sources. The additive process machine includes a substrate holder configured to hold a substrate. The substrate holder and the additive sources are configured to rotate with respect to each other around a center of rotation. A first end of the printing zone is extending to the center of rotation. A second end of the printing zone extends a distance from the center of rotation. The pattern generation circuit is configured to operate each additive source at an actuation frequency proportional to a distance of the additive source from the center of rotation.

DETAILED DESCRIPTION

Figure 1:
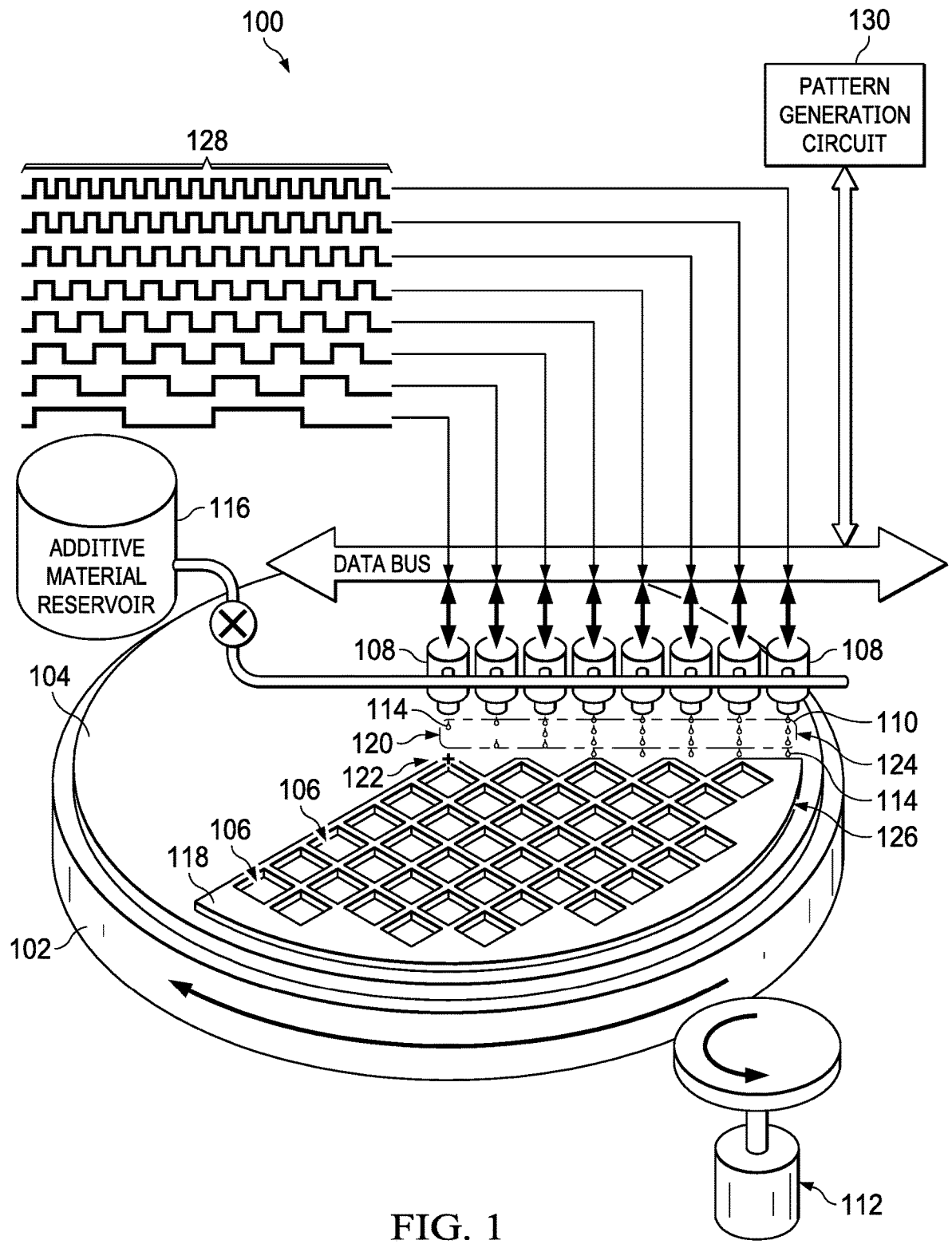
FIG. 1 depicts an example method of forming a patterned layer of additive material on a substrate, using an example additive process machine.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A patterned layer of additive material on a substrate within a circular printing area by an additive process using additive sources distributed across a printing zone. The substrate is rotated relative to the additive sources around a center of rotation, so that a first end of the printing zone extends toward, or to, the center of rotation of the substrate with respect to the additive sources. The additive sources are actuated to form a predetermined discrete amount of the additive material on the substrate with each actuation, as the substrate and the additive sources are rotated with respect to each other. The predetermined discrete amounts from the additive sources may be uniform in volume or mass, within tolerances encountered in forming additive material from the specific type of additive sources. The additive material forms a patterned layer on the substrate. A second end of the printing zone extends toward, or to, a perimeter of the substrate. Thus, all the additive sources are fully engaged in forming the layer of additive material on the substrate during rotation of the substrate with respect to the additive sources. Each additive source is operated at an actuation frequency that is proportional to a distance of the additive source from the center of rotation. That is, actuation waveforms are transmitted to the additive source at the relevant actuation frequency. Each actuation waveform may be a formation signal, which results in the additive source forming a predetermined discrete amount of the additive material onto the substrate, or may be a null signal, which results in the additive source omitting formation of the additive material onto the substrate during that cycle of the actuation frequency. Thus, the layer of additive material may have geometries with the additive material and open spaces without, or free of, the additive material. The perimeter of the patterned layer may be circular, centered on the center of rotation, but may have any desired shape. Operating the additive sources at actuation frequencies proportional to their distances from the center of rotation may advantageously provide more uniform coverage on the substrate by the additive material in the patterned layer, compared to operating the additive sources at a single frequency.

An additive process machine for forming a patterned layer of additive material has additive sources distributed across a printing zone. The additive process machine includes a substrate holder configured to hold a substrate and includes a rotational mechanism for rotating the substrate holder and the additive sources with respect to each other. In one manifestation, the rotational mechanism may be operable to rotate the substrate holder, and the substrate, while holding the additive sources stationary. In another manifestation, the rotational mechanism may be operable to rotate the additive sources while holding the substrate holder, and the substrate, stationary. The patterned layer may be centered on a center of rotation of the substrate. A first end of the printing zone extends toward, or to, the center of rotation, and a second end of the printing zone extends toward, or to, the perimeter of the patterned layer. The additive sources are configured for actuation for forming predetermined discrete amounts, that may be uniform in volume or mass, of additive material on the substrate, while the rotational mechanism is rotating the substrate with respect to the additive sources. The additive process machine includes a pattern generation circuit configured to provide formation signals to the additive sources. The pattern generation circuit is configured to provide the formation signals to each additive source in periods of an actuation frequency that is proportional to a distance of the additive source from the center of rotation. Either one formation signal or no formation signal is provided in each cycle of the actuation frequency.

FIG. 1 depicts an example method of forming a layer of additive material within a circular printing area, using an example additive process machine. In this example, the additive process machine 100 has a substrate holder 102 configured to hold a substrate 104. The substrate 104 may be flat and circular in shape, as depicted in FIG. 1, or may have another shape. In one version of this example, the substrate 104 may be implemented as a wafer for forming microelectronic devices 106, such as integrated circuits, microelectromechanical system (MEMS) devices, optoelectronic devices, microfluidic devices, or micro-optical mechanical system (MOMS) devices. The substrate holder 102 may be implemented to hold the substrate 104 forming a partial vacuum between the substrate holder 102 and the substrate 104 or by a mechanical clamping fixture, by way of example.

The additive process machine 100 further includes additive material sources 108, referred to herein as additive sources 108, distributed across a printing zone 110. In this example, the additive sources 108 may be evenly spaced in a linear array along the printing zone 110 in a radial direction from a center of rotation 122, as depicted in FIG. 1. Other arrangements of the additive sources, such as parallel linear arrays, are within the scope of this example. In this example, the additive sources 108 may be implemented as drop-on-demand nozzles, as indicated in FIG. 1 that may provide predetermined discrete amounts of an additive material 114 to the substrate 104 at an actuation frequency. Other additive process machines are within the scope of this example, for example that may provide nonuniform amounts of the additive material. FIG. 1 depicts the additive process machine 100 as having eight additive sources 108 to clearly depict the individual additive sources 108; in practice, an additive process machine for forming a patterned layer of additive material on a semiconductor wafer, for example, could have hundreds or thousands of additive sources.

The additive process machine 100 includes a rotational mechanism 112 for rotating the substrate holder 102 and the additive sources 108 with respect to each other. In versions of this example in which the substrate 104 is implemented as a wafer, the rotational mechanism 112 may be operable to rotate the substrate holder 102, and the substrate 104, while holding the additive sources 108 stationary, as indicated in FIG. 1. In other versions of this example, the rotational mechanism 112 may be operable to rotate the additive sources 108 while holding the substrate holder 102, and the substrate 104, stationary.

The additive sources 108 may form predetermined discrete amounts of the additive material 114 on the substrate 104 as the rotational mechanism 112 rotates the substrate 104 around a center of rotation 122 under the additive sources 108. The predetermined discrete amount may correspond to a predetermined area on the substrate 108, e.g. a number of square microns. The additive material 114 may be provided to the additive sources 108 from a common additive material reservoir 116, as depicted in FIG. 1, or the additive material 114 may be provided to the additive sources 108 from a plurality of additive material reservoirs, not shown in FIG. 1. The additive material 114 is formed in a layer 118 within a printed pattern on the substrate 104. The printing zone 110 has a first end 120 extending to the center of rotation 122 of the substrate 104 with respect to the additive sources 108. The printing zone 110 has a second end 124, located opposite from the first end 120; the second end 124 extends to a perimeter 126 of the printed pattern.

During operation of the additive process machine 100, each additive source 108 may be operated at an actuation frequency that is proportional to a distance of that additive source 108 from the center of rotation 122. Actuation frequency waveforms 128 depict the relative actuation frequencies used to operate the additive sources 108. For example, the actuation frequency of each additive source 108 may be proportional to the radial distance of that additive source 108 to the center of rotation 122, as disclosed in reference to FIG. 3A and FIG. 3B. The additive process machine 100 includes a pattern generator 130 which may provide actuation waveforms at the appropriate actuation frequency to each additive source 108, that is, one actuation waveform in each cycle of the actuation frequency. Each actuation waveform may be a formation signal, which results in the additive source 108 forming a predetermined discrete amount of the additive material 114 onto the substrate 104, or may be a null signal, which results in the additive source 108 omitting formation of the additive material 114 onto the substrate 104. The waveforms 128 thus represent a maximum rate at which a formation signal may be directed to each additive source 108. Conversely, each of the waveforms 128 has a cycle time, or minimum period, and formation signals may be separated in time by an integer number of the minimum period, and so may occur at integer increments of the minimum period. When one or more null signals falls between two formation signals, those formation signals are separated by an integer plurality of periods. The actuation frequencies may be implemented with some unintended variations in the periods, commonly referred to as jitter. Thus, formation signals that are separated by an integer plurality of periods may be separated by a time period that is not exactly a product of the integer and an average time period of the actuation frequency, due to jitter. When the printed pattern is formed on the substrate 104, the pattern generator 130 provides the appropriate actuation waveforms to form the layer 118 of the additive material 114. The actuation waveforms may be implemented as electrical signals, optical signals, acoustic signals, or pneumatic signals, by way of example. The actuation waveforms may be provided to the additive sources 108 through a data bus, labeled "DATA BUS" in FIG. 1. Following formation of the layer 118 on the substrate 104, the substrate 104 may be heated to modify properties of the additive material 114 on the substrate 104. The additive material 114 may include, for example, silicon dioxide, silicon nitride, a metal, a polymer, or polycrystalline silicon.

Figure 2:
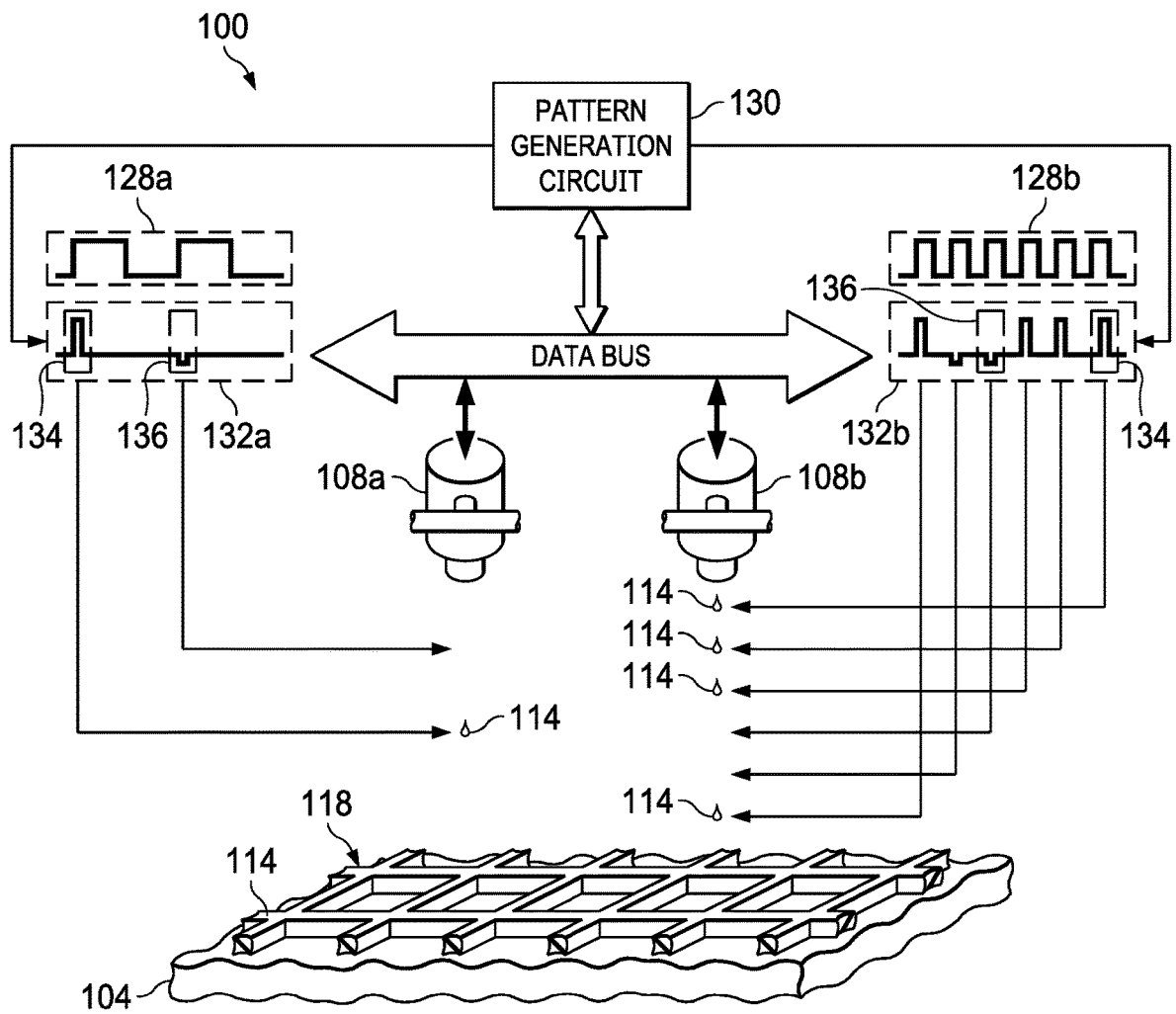
FIG. 2 depicts example actuation waveforms generated by the pattern generator.

FIG. 2 depicts example actuation waveforms generated by the pattern generator 130. The pattern generator 130 generates first actuation waveforms 132a which are provided to a first additive source 108a of the additive sources 108 of FIG. 1. The first actuation waveforms 132a are provided at a first actuation frequency, characterized by a first frequency waveform 128a. That is, exactly one of the first actuation waveforms 132a is provided in each cycle of the first actuation frequency. The pattern generator 130 concurrently generates second actuation waveforms 132b which are provided to a second additive source 108b of the additive sources 108 of FIG. 1. The second actuation waveforms 132b are provided at a second actuation frequency, characterized by a second frequency waveform 128b. Exactly one of the second actuation waveforms 132b is provided in each cycle of the second actuation frequency. In this example, the second additive source 108b is located at a greater distance from the center of rotation 122 of FIG. 1 than the first additive source 108a, and so the second actuation frequency is greater than the first actuation frequency, as indicated by second frequency waveform 128b vis-à-vis the first frequency waveform 128a. The first actuation waveforms 132a and the second actuation waveforms 132b include formation signals 134, which result in the additive sources 108a and 108b forming predetermined discrete amounts of the additive material 114 onto the substrate 104. The first actuation waveforms 132a and the second actuation waveforms 132b also include null signals 136, which result in the additive sources 108a and 108b omitting formation of the additive material 114 onto the substrate 104. The formation signals 134 may be implemented as pulses, rising edges, or falling edges, by way of example. The null signals 136 may be implemented as a pulse of opposite polarity from a formation signal 134, as depicted in FIG. 2, or by a constant signal level, such as a ground level, by way of example. Other implementations for the formation signals 134 and the null signals 136 are within the scope of this example. Forming the predetermined discrete amounts of the additive material 114 by the formation signals 134 as the substrate 104 is rotated with respect to the additive sources 108 forms the layer 118 of the additive material 114.

Figure 3A:
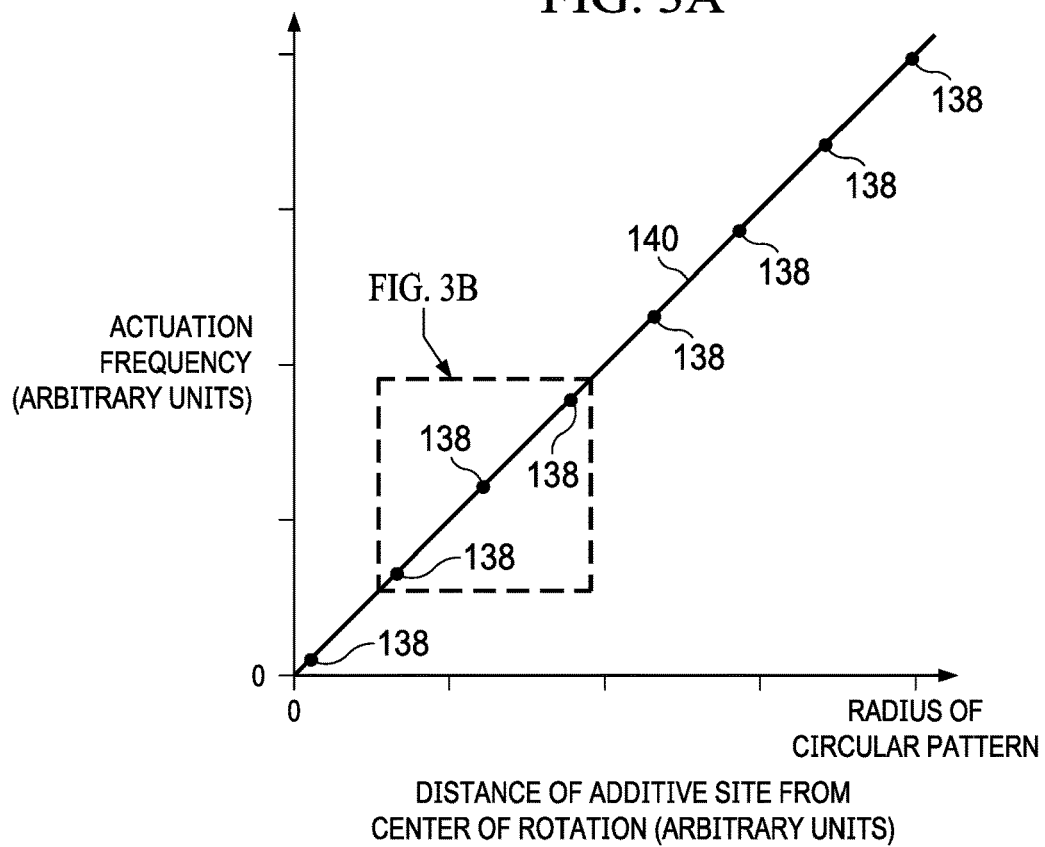
FIG. 3A and FIG. 3B are charts of actuation frequencies for the additive sources versus distances of the additive sources from the center of rotation.
Figure 3B:
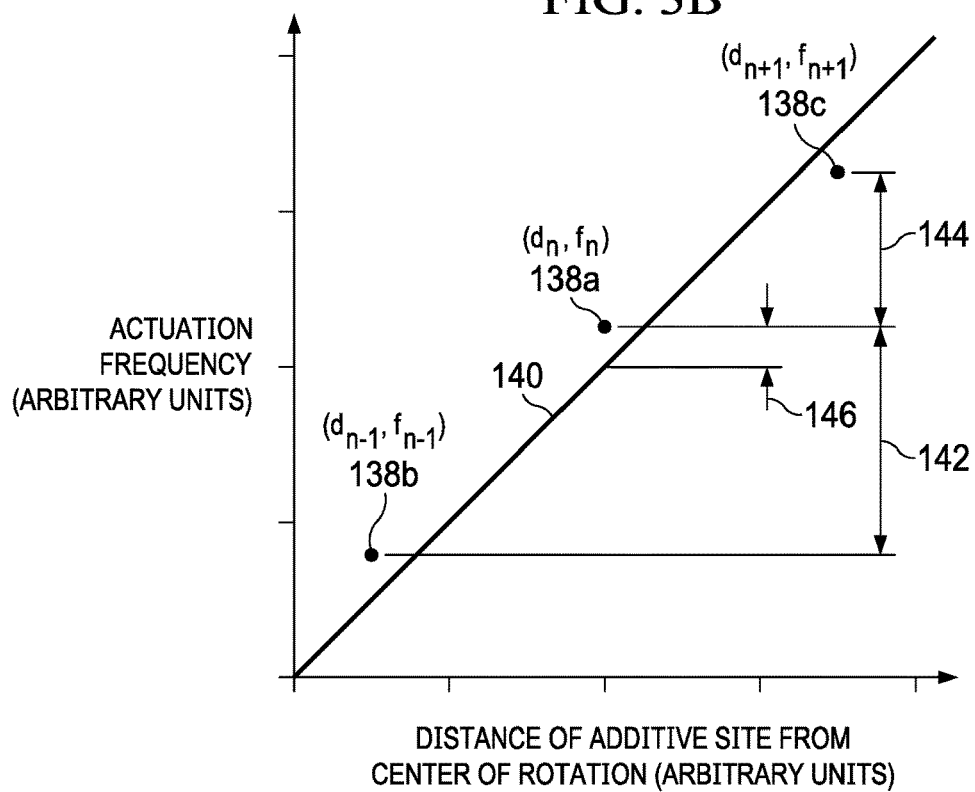

FIG. 3A and FIG. 3B are charts of actuation frequencies for the additive sources 108 versus distances of the additive sources 108 of FIG. 1 from the center of rotation 122 of FIG. 1. Referring to FIG. 3A, the horizontal axis of the chart is the distances from the additive sources 108 from the center of rotation 122. The vertical axis of the charts is the actuation frequencies at which the pattern generator 130 of FIG. 2 provides the formation signals 134 of FIG. 2 and the null signals 136 of FIG. 2 to the additive sources 108 of FIG. 2. The operation points 138 of the chart correspond to the additive sources 108. The actuation frequencies being proportional to the distances of the additive sources 108 from the center of rotation 122 of FIG. 1 is characterized by the operation points 138 lying approximately on a proportionality line 140 which passes through an origin of the chart, the origin having the value of zero actuation frequency and zero distance from the center of rotation 122. The proportionality line 140 may be expressed as:

actuation frequency=slope×distance from the center of rotation

Where slope is a slope of the proportionality line 140.

The proportionality line 140 may be obtained by a least squares analysis of the operation points 138, for example. The slope of the proportionality line 140 may be expressed by the following relationship, obtained from a least squares analysis:

$$\text{slope} = \frac{\sum_{n=1}^{N} f_n \times d_n}{\sum_{n=1}^{N} d_n \times d_n}$$

Where:
N=total number of additive sources;
$f_n$=actuation frequency of actuation waveforms provided to nth additive source; and
$d_n$=radial distance of nth additive source from center of rotation.

FIG. 3B is an expanded view of three sequential operation points 138 of FIG. 3A. A first operation point 138a may be any operation point 138 of FIG. 3A, except for the first of the operation points 138, corresponding to the least distance to the center of rotation 122 of FIG. 1, and except for the last of the operation points 138, corresponding to the greatest distance to the center of rotation 122. A second operation point 138b is the operation point 138 immediately before the first operation point 138a, and a third operation point 138c is the operation point 138 immediately after the first operation point 138a. The first operation point 138a represents a distance $d_n$ to the center of rotation 122, and an actuation frequency of $f_n$.

The second operation point 138b represents a distance $d_{n-1}$ to the center of rotation 122, and an actuation frequency of $f_{n-1}$. $D_{n-1}$ is less than $d_n$ by a distance between the additive source 108 in FIG. 1 corresponding to the first operation point 138a and the additive source 108 corresponding to the second operation point 138b. The additive sources 108 corresponding to the first operation point 138a and the second operation point 138b are directly adjacent to each other.

The third operation point 138c represents a distance $d_{n+1}$ to the center of rotation 122, and an actuation frequency of $f_{n-1}$. $D_{n+1}$ is greater than $d_n$ by a distance between the additive source 108 corresponding to the first operation point 138a and the additive source 108 corresponding to the third operation point 138c. The additive sources 108 corresponding to the first operation point 138a and the third operation point 138c are directly adjacent to each other. $F_{n+1}$, the actuation frequency of the third operation point 138c, is greater than $f_n$, the actuation frequency of the first operation point 138a, by a second frequency difference 144.

The pattern generator 130 of FIG. 1 is configured to provide the actuation waveforms to each additive source 108 at an actuation frequency that is proportional to a distance of the additive source 108 from the center of rotation 122. For the purposes of this disclosure, the phrase "the actuation frequency is proportional to the distance of the additive source 108 from the center of rotation 122" will encompass the following three constraints for each additive source 108 of the additive process machine 100.

The first constraint is: the actuation frequency provided to each additive source 108 is greater than any of the actuation frequencies provided to the additive sources 108 that are closer to the center of rotation 122. In reference to FIG. 3B, $f_n$, the actuation frequency of the first operation point 138a, is greater than $f_{n-1}$, the actuation frequency of the second operation point 138b, by a first frequency difference 142.

The second constraint is: the actuation frequency provided to each additive source 108 is less than any of the actuation frequencies provided to the additive sources 108 that are farther away from the center of rotation 122. In reference to FIG. 3B, $f_n$, the actuation frequency of the first operation point 138a, is less than $f_{n+1}$, the actuation frequency of the third operation point 138c, by a second frequency difference 144.

Figure 4A:
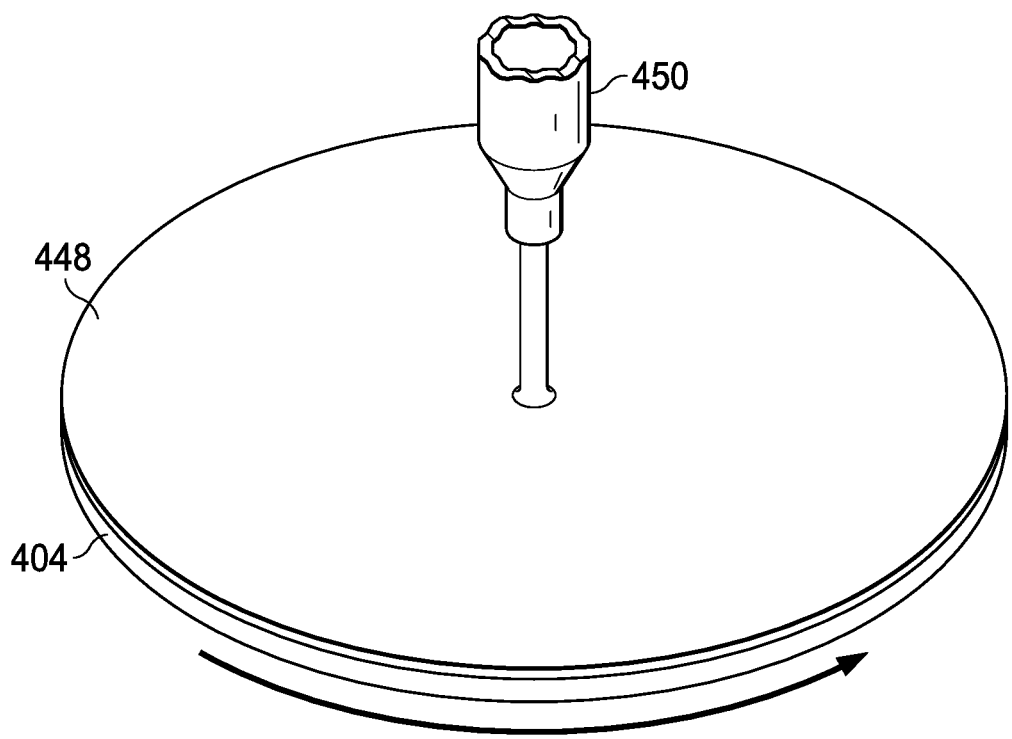
FIG. 4A through FIG. 4C depict another example method of forming a patterned layer of additive material using another example additive process machine.
Figure 4C:
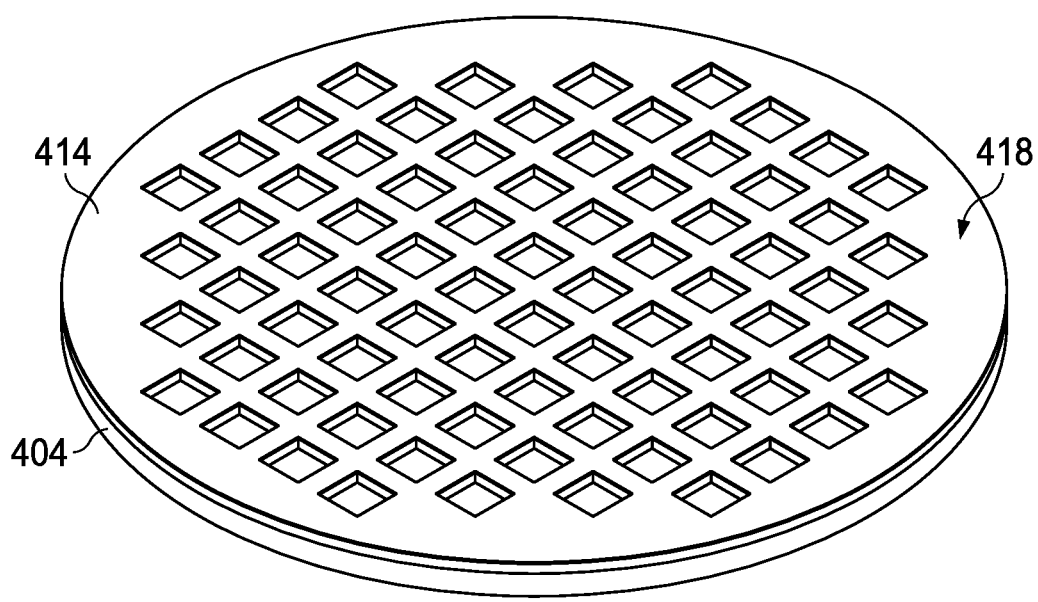
Figure 4B:
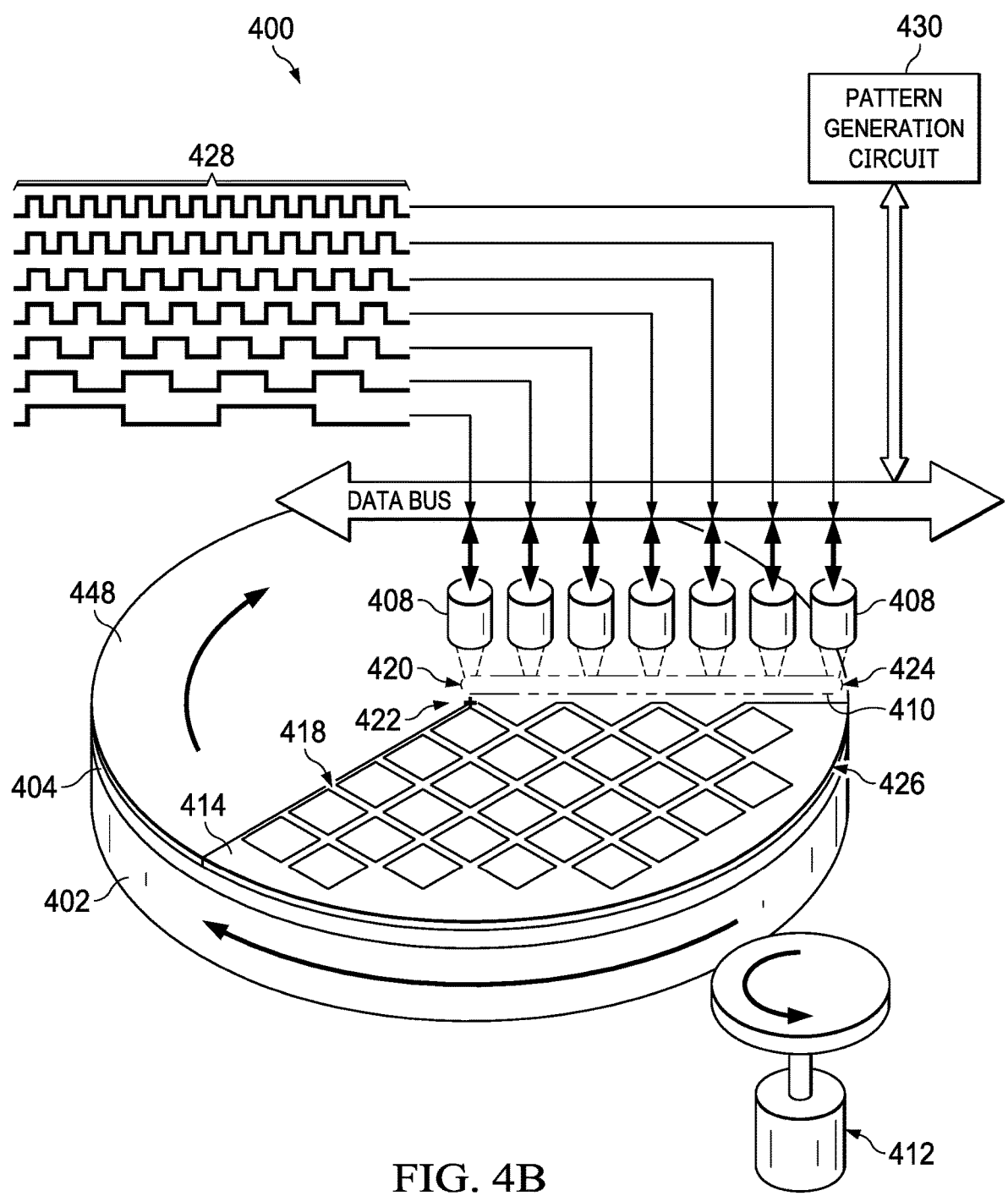

The third constraint is: a magnitude, that is, an absolute value, of a difference between the actuation frequency provided to each additive source 108 and a frequency of the proportionality line 140 corresponding to the distance of the additive source 108 from the center of rotation 122, is less than a magnitude of a difference between the actuation frequency provided to the additive source 108 and the actuation frequency provided to any additive source 108 that is immediately adjacent to the additive source 108. In reference to FIG. 3B, the first operation point 138a has a vertical offset Δf 146 from the proportionality line 140 which is less than the first frequency difference 142 and is less than the second frequency difference 144. The vertical offset Δf 146 is the magnitude, or absolute value, of the difference in frequency between the first operation point 138a and a point on the proportionality line 140 corresponding to a distance from the center of rotation 122 equal to the distance from the center of rotation 122 corresponding to the first operation point 138a, as depicted in FIG. 3B. The third constraint may be expressed by:

$$\Delta f = abs[f_n - (slope \times d_n)]$$

$$\Delta f < f_n - f_{n-1} \text{ and } \Delta f < f_{n+1} - f_n$$

where:
abs is the absolute value, or magnitude of the expression in square brackets, and
$f_n$, slope, and $d_n$ are defined above FIG. 4A through FIG. 4C depict another example method of forming a pattern of additive material in circular tracks using another example additive process machine. Referring to FIG. 4A, a substrate 404 is coated with an additive material precursor 448. The substrate 404 may be circular in shape, as depicted in FIG. 4A, or may have another shape, such as square, rectangular, octagonal, or triangular, by way of example. The substrate 404 may be implemented as a microelectronic substrate, such as a semiconductor wafer, for example. Alternatively, the substrate 404 may be implemented as a ceramic substrate, a sapphire wafer, a glass wafer, a polymer disc, or a metal disc. Other implementations of the substrate 404 are within the scope of this example. In one version of this example, the additive material precursor 448 may be implemented as a photosensitive monomer, optionally with a solvent. In another version, the additive material precursor 448 may be implemented as a mixture of a monomer and a photoinitiator, optionally with a solvent. In a further version, the additive material precursor 448 may be implemented as a mixture of a monomer, an oligomer, and a photoinitiator, optionally with a solvent. The substrate 404 may be coated with the additive material precursor 448 by a spin coat process, as depicted in FIG. 4A, in which the additive material precursor 448 is dispensed on the substrate 404 by a fluid dispenser nozzle 450 and the substrate 404 is rotated to distribute the additive material precursor 448 across the substrate 404. Alternatively, the substrate 404 may be coated with the additive material precursor 448 by a spray process or a tape application process, by way of example.

The substrate 404 may subsequently be heated to remove volatile materials, such as solvent, from the additive material precursor 448. By way of example, the substrate 404 may be heated by a hotplate heating process to 100° C. to 150° C. for 5 minutes to 60 minutes, optionally in a flowing dry ambient such as nitrogen to extract the volatile materials.

Referring to FIG. 4B, the substrate 404 is placed on a substrate holder 402 of an additive process machine 400. The additive process machine 400 further includes additive sources 408 distributed across a printing zone 410. In this example, the additive sources 408 may be implemented as photonic emitters 408 which expose the additive material precursor 448 to predetermined doses of ultraviolet (UV) radiation to polymerize the additive material precursor 448 to form predetermined discrete amounts of an additive material 414 in a layer 418 on the substrate 404. The photonic emitters 408 may be implemented as UV light emitting diodes (LEDs) 408 or as UV solid state lasers 408, by way of example. The additive sources 408 may include optical elements such as lenses to focus the UV radiation. FIG. 4B depicts the additive process machine 400 as having seven additive sources 408 to clearly depict the individual additive sources 408; in practice, an additive process machine for forming a patterned layer of additive material on a semiconductor wafer, for example, would have hundreds or thousands of additive sources. The additive process machine 400 includes a rotational mechanism 412 for rotating the substrate holder 402 and the additive sources 408 with respect to each other around a center of rotation 422. In this example, the rotational mechanism 412 may be operable to rotate the substrate holder 402, and the substrate 404, while holding the additive sources 408 stationary, as indicated in FIG. 4B.

The additive sources 408 form predetermined discrete amounts of the additive material 414 by exposing the additive material precursor 448 on the substrate 404 with a predetermined discrete amount of UV radiation as the rotational mechanism 412 rotates the substrate 404 under the additive sources 408. The additive material 414 is formed in a patterned layer 418 on the substrate 404. The printing zone 410 has a first end 420 extending to the center of rotation 422 of the substrate 404 with respect to the additive sources 408. The printing zone 410 has a second end 424, located opposite from the first end 420; the second end 424 extends to a perimeter 426 of the patterned layer 418.

Each additive source 408 is operated at an actuation frequency that is proportional to a distance of the additive source 408 from the center of rotation 422, as disclosed in reference to FIG. 2, FIG. 3A and FIG. 3B. Actuation frequency waveforms 428 depicts the relative actuation frequencies used to operate the additive sources 408. The additive process machine 400 includes a pattern generator 430 which provides actuation waveforms at the appropriate actuation frequency to each additive source 408. Each actuation waveform may be a formation signal, which results in the additive source 408 exposing the additive material precursor 448 to form a predetermined discrete amount of the additive material 414, or may be a null signal, which results in the additive source 408 not exposing the additive material precursor 448. The pattern generator 430 provides the appropriate actuation waveforms to form the layer 418 of the additive material 414. The actuation waveforms may be provided to the additive sources 408 through a data bus, labeled "DATA BUS" in FIG. 4B.

Referring to FIG. 4C, the substrate 404 may be rinsed with a solvent to dissolve the additive material precursor 448 of FIG. 4B which was not exposed, leaving the additive material 414 on the substrate 404 in the layer 418. The solvent may include an alcohol, such as n-hexanol, a ketone, such as methyl ethyl ketone, or an aromatic solvent such as xylene, by way of example. Subsequently, the substrate 404 may be heated to remove additional volatile material from the additive material 414 and to cure the additive material 414 on the substrate 404.

Figure 5:
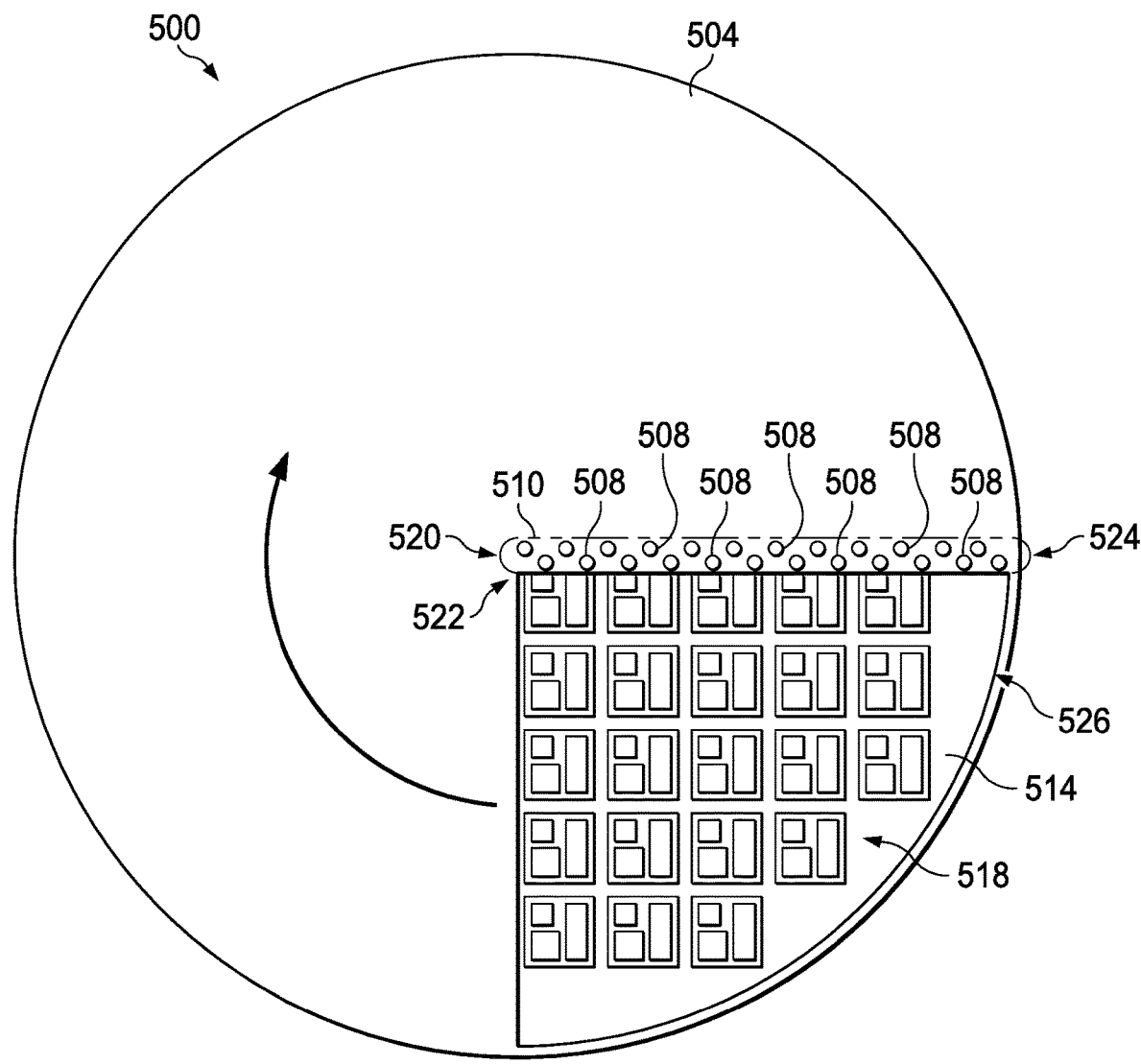
FIG. 5 is a top view of an example configuration of additive sources for forming a patterned layer.

FIG. 5 is a top view of an example configuration of additive sources for forming a patterned layer. In this example, an additive process machine 500 has additive sources 508 configured in two parallel linear arrays. The additive sources 508 in each linear array may be evenly spaced along the printing zone 510, as depicted in FIG. 5. The additive sources 508 are distributed across a printing zone 510. The printing zone 510 has a first end 520 and has a second end 524, located opposite from the first end 520. Having the additive sources 508 configured in two parallel linear arrays may advantageously enable a denser coverage of the additive sources 508 along the printing zone 510. Having the additive sources 508 configured in three or more parallel linear arrays is within the scope of this example.

During operation of the additive process machine 500, a substrate 504 and the additive sources 508 are rotated with respect to each other around a center of rotation 522. The first end 520 of the printing zone 510 is located at the center of rotation 522. The additive sources 508 form predetermined discrete amounts of an additive material 514 on the substrate 504 as the substrate 504 and the additive sources 508 are rotated with respect to each other, forming a patterned layer 518 of the additive material 514 on the substrate 504. The second end 524 of the printing zone 510 extends to a perimeter 526 of the patterned layer 518. Each additive source 508 is operated at an actuation frequency that is proportional to a distance of the additive source 508 from the center of rotation 522, as disclosed in reference to FIG. 2, FIG. 3A and FIG. 3B. Actuation waveforms are provided to the additive sources 508 at the corresponding actuation frequencies by a pattern generator, not shown in FIG. 5, of the additive process machine 500, similar to the pattern generator 130 of FIG. 1.

Figure 6:
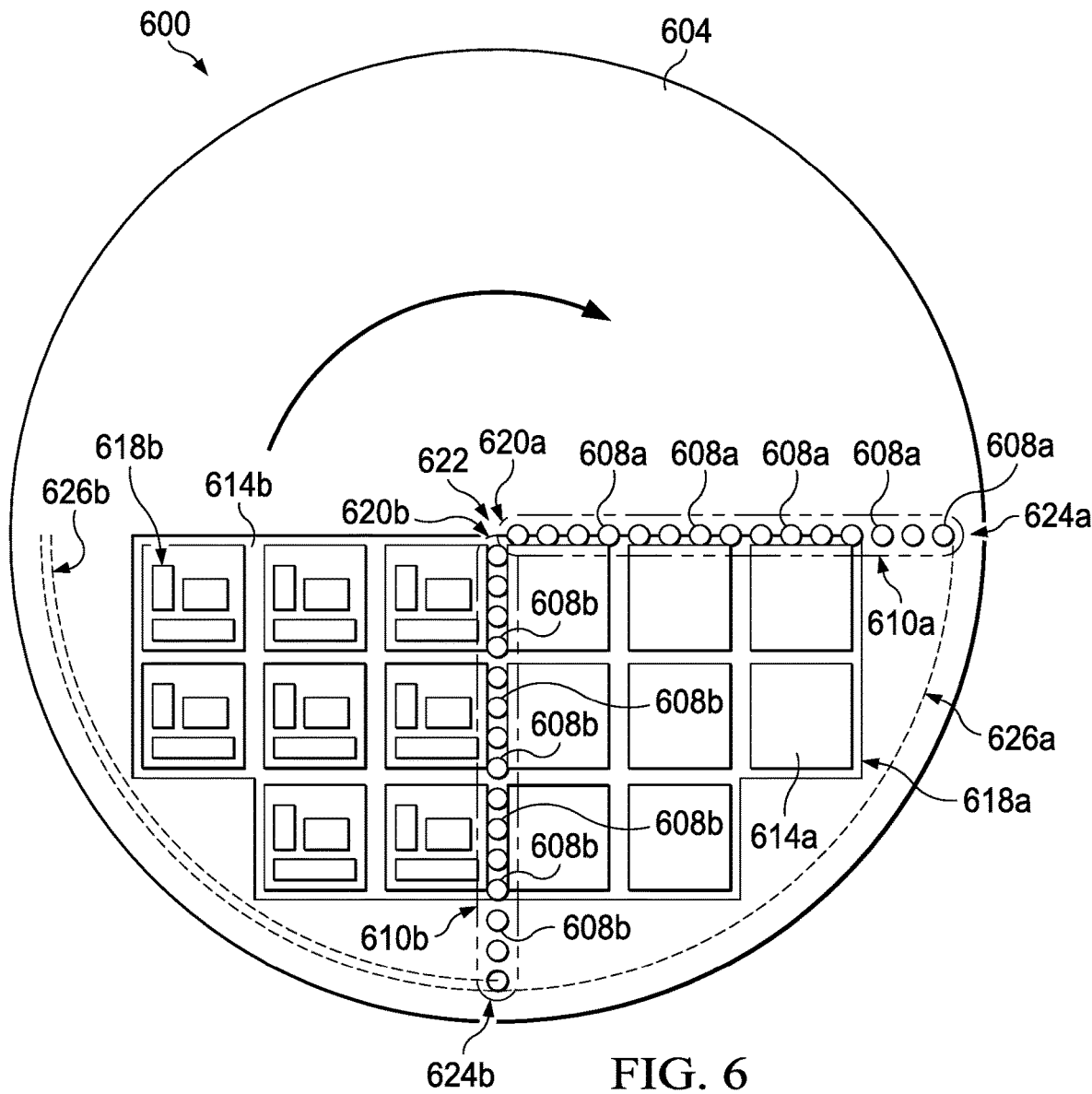
FIG. 6 is a top view of another example configuration of additive sources for forming a patterned layer.

FIG. 6 is a top view of another example configuration of additive sources for forming a patterned layer. In this example, an additive process machine 600 includes first additive sources 608*a* configured in a first linear array. The first additive sources 608*a* may be evenly spaced, as depicted in FIG. 6. The first additive sources 608*a* are distributed across a first printing zone 610*a*. The first printing zone 610*a* has a first end 620*a* and has a second end 624*a*, located opposite from the first end 620*a* of the first printing zone 610*a*. Each of the first additive sources 608*a* are configured to form a first predetermined discrete amount of a first additive material 614*a* on a substrate 604. The additive process machine 600 of this example further includes second additive sources 608*b* configured in a second linear array. The second additive sources 608*b* may be evenly spaced, as depicted in FIG. 6. The second additive sources 608*b* are distributed across a second printing zone 610*b*. The second printing zone 610*b* has a first end 620*b* and has a second end 624*b*, located opposite from the first end 620*b* of the second printing zone 610*b*. Each of the second additive sources 608*b* are configured to form a second predetermined discrete amount of a second additive material 614*b* on the substrate 604.

During operation of the additive process machine 600, a substrate 604 is rotated around a center of rotation 622 with respect to the first additive sources 608*a* and the second additive sources 608*b*. The first end 620*a* of the first printing zone 610*a* is located at the center of rotation 622. Similarly, the first end 620*b* of the second printing zone 610*b* is located at a center of rotation 622 of the rotational motion of the substrate 604 with respect to the first additive sources 608*a* and the second additive sources 608*b*.

The first additive sources 608*a* form predetermined discrete amounts of the first additive material 614*a* on the substrate 604 as the substrate 604 is rotated with respect to the first additive sources 608*a* and the second additive sources 608*b*, forming a first patterned layer 618*a* of the first additive material 614*a* on the substrate 604. The second end 624*a* of the first printing zone 610*a* extends to a first perimeter 626*a* of the first patterned layer. The first perimeter 626*a* demarcates a maximum extent of the first additive material 614*a* on the substrate 604. The first additive material 614*a* may optionally be recessed from the first perimeter 626*a* along a portion, or all of, the first perimeter 626*a*, as depicted in FIG. 6, so that the first additive material 614*a* lies within the first layer 618*a*.

The second additive sources 608*b* form predetermined discrete amounts of the second additive material 614*b* on the substrate 604 as the substrate 604 is rotated with respect to the first additive sources 608*a* and the second additive sources 608*b*, forming a second patterned layer 618*b* of the second additive material 614*b* on the substrate 604. The second end 624*b* of the second printing zone 610*b* extends to a second perimeter 626*b* of the second patterned layer. The second perimeter 626*b* of the second patterned layer may be inside the first perimeter 626*a* of the first patterned layer, as depicted in FIG. 6. In another version of this example, the second perimeter 626*b* may be coincident with the first perimeter 626*a*. In a further version, the second perimeter 626*b* may be outside the first perimeter 626*a*. The second perimeter 626*b* demarcates a maximum extent of the second additive material 614*b* on the substrate 604. The second additive material 614*b* may optionally be recessed from the second perimeter 626*b* along a portion, or all of, the second perimeter 626*b*, as depicted in FIG. 6, so that the second additive material 614*b* lies within the second patterned layer.

Each first additive source 608*a* is operated at a first actuation frequency that is proportional to a distance of the first additive source 608*a* from the center of rotation 622, as disclosed in reference to FIG. 2, FIG. 3A and FIG. 3B. Similarly, each second additive source 608*b* is operated at a second actuation frequency that is proportional to a distance of the second additive source 608*b* from the center of rotation 622, as disclosed in reference to FIG. 2, FIG. 3A and FIG. 3B. The first additive sources 608*a* and the second additive sources 608*b* may have actuation waveforms at the corresponding first and second actuation frequencies, provided by a common pattern generator, not shown in FIG. 6, similar to the pattern generator 130 of FIG. 1, or may have corresponding first and second actuation waveforms provided by separate pattern generators, not shown in FIG. 6, wherein each of the separate pattern generators is similar to the pattern generator 130 of FIG. 1.

The first additive material 614a and the second additive material 614b may be complementary materials, such as silicon dioxide and silicon nitride, or n-type polycrystalline silicon and p-type polycrystalline silicon. Having the first additive sources 608a and the second additive sources 608b configured to form the first additive material 614a and the second additive material 614b concurrently on the substrate 604 may advantageously improve a cycle time and equipment usage factor of the additive process machine 600.

Figure 7:
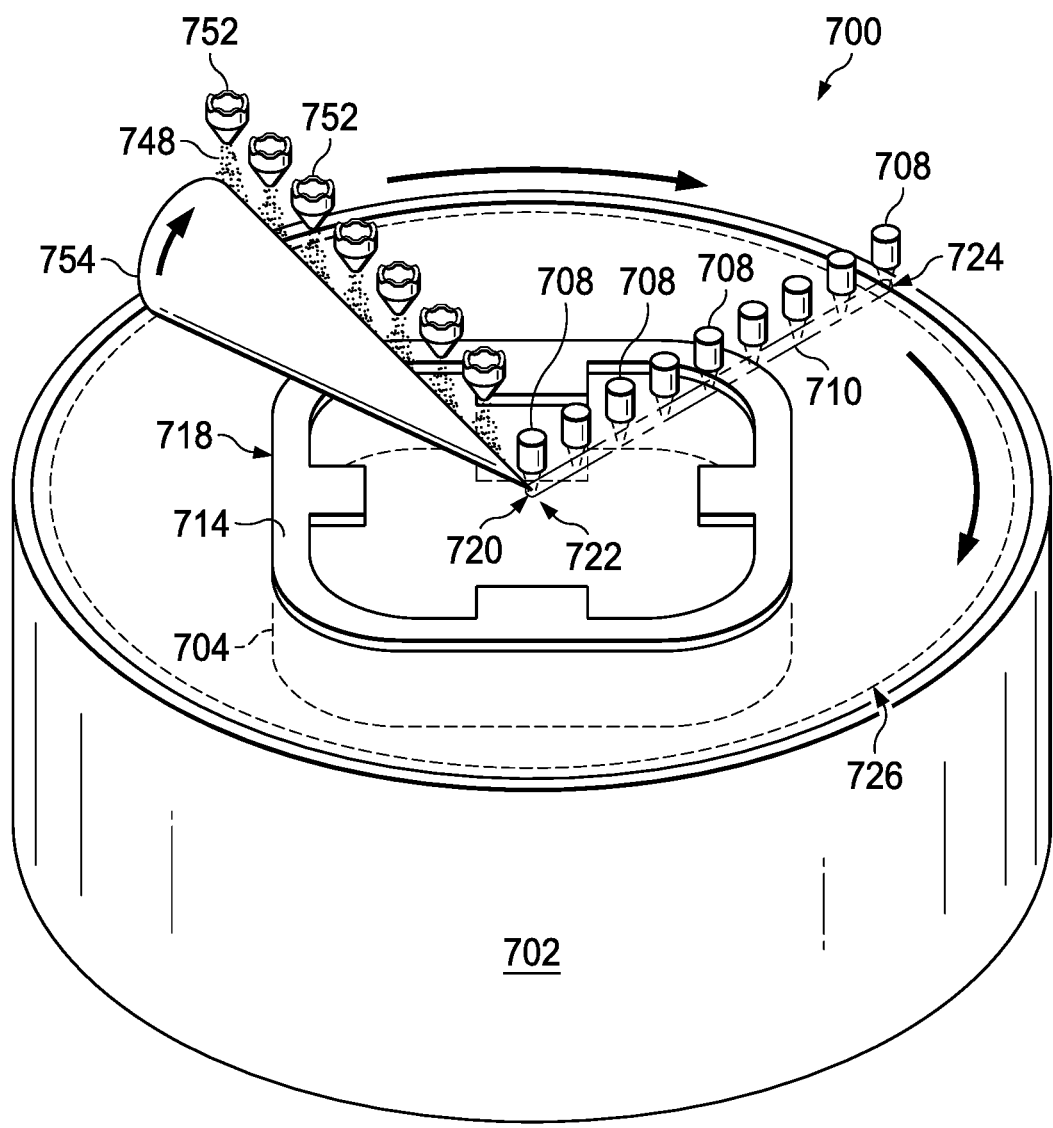
FIG. 7 depicts another example method of forming a patterned layer of additive material using another example additive process machine.

FIG. 7 depicts another example method of forming a patterned layer of additive material using another example additive process machine. The additive process machine 700 includes a substrate holder 702. The substrate holder 702 is configured to hold a substrate 704. In this example, the additive process machine 700 includes precursor dispensers 752 configured to dispense an additive material precursor 748 onto a roller 754, which may be implemented as a conical roller 754 as depicted in FIG. 7, of the additive process machine 700. The additive process machine 700 is configured to rotate the conical roller 754 over the substrate 704 while rotating the precursor dispensers 752 with respect to the substrate 704 around a center of rotation 722, as indicated in FIG. 7. The precursor dispensers 752 dispense the additive material precursor 748 onto the conical roller 754, and the conical roller 754 transfers the additive material precursor 748 onto the substrate 704. In an alternate version of this example, the roller 754 may be implemented as a cylindrical roller, or a roller having yet another shape. The additive process machine 700 further includes additive sources 708 distributed across a printing zone 710. The additive sources 708 may be evenly spaced in a linear array, as depicted in FIG. 7. The additive sources 708 convert the additive material precursor 748 that was transferred onto the substrate 704 into a layer 718 of an additive material 714 on the substrate 704.

In some versions of this example, the additive material precursor 748 may be implemented as a powder, a slurry, or a fluid, by way of example. The additive sources 708 may be implemented as lasers or LEDs, and may convert the additive material precursor 748 into the additive material 714 through a process of sintering, fusing, or polymerization, by way of example.

In other versions of this example, the additive material precursor 748 may be implemented as a powder, and the additive sources 708 may be implemented as dispensers of a liquid binding agent. The additive material precursor 748 is converted into the additive material 714 through a process of binding the powder with the liquid binding agent, sometimes referred to as a binder jetting process.

The additive process machine 700 of this example is configured to rotate the additive sources 708 with respect to the substrate 704 around the center of rotation 722, as indicated in FIG. 7, while the additive sources 708 convert the additive material precursor 748 into the additive material 714 in a patterned layer 718 on the substrate 704. The patterned layer 718 has a perimeter 726; the substrate 704 may optionally be recessed from the perimeter 726, as depicted in FIG. 7. The printing zone 710 has a first end 720 extending to center of rotation 722 of the additive sources 708 with respect to the substrate 704. The printing zone 710 has a second end 724 located opposite from the first end 720. The second end of the printing zone 710 extends to the perimeter 726 of the patterned layer 718. The conical roller 754 may extend from the perimeter 726 of the patterned layer 718 to the center of rotation 722, as depicted in FIG. 7.

During operation of the additive process machine 700, each additive source 708 is operated at an actuation frequency that is proportional to a distance of the additive source 708 from the center of rotation 722, as disclosed in reference to FIG. 2, FIG. 3A and FIG. 3B. Actuation waveforms are provided to the additive sources 708 at the corresponding actuation frequencies, by a pattern generator, not shown in FIG. 7, similar to the pattern generator 130 of FIG. 1. The additive material precursor 748 may be dispensed onto the conical roller 754 from each of the precursor dispensers 752 at rates which are proportional to a distance of the precursor dispenser 752 from the center of rotation 722, which may advantageously provide a uniform layer of the additive material precursor 748 on the substrate 704.

Various features of the examples disclosed herein may be combined in other example methods of forming a patterned layer of additive material using other example additive process machines. For example, the additive process machine 100 may be implemented to perform the photonic polymerization process disclosed in reference to FIG. 4A through FIG. 4C. The additive process machines 500 and 600 of FIG. 5 and FIG. 6, respectively, may be implemented to perform the drop-on-demand process disclosed in reference to FIG. 1, or the photonic polymerization process disclosed in reference to FIG. 4A through FIG. 4C. The additive sources 108, 408, 608a and 608b, and 708 of FIG. 1, FIG. 4B, FIG. 6, and FIG. 7, respectively, may be configured in two or more parallel linear arrays, as disclosed in reference to FIG. 5.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A method of forming an electronic device, comprising:
   rotating a semiconductor wafer relative to a plurality of additive sources, the semiconductor wafer having an axis of rotation, each additive source configured to produce an amount of an additive material on the semiconductor wafer in response to a corresponding actuation signal; and
   directing towards each additive source the corresponding actuation signal, thereby forming over the semiconductor wafer an additive material layer that defines a feature of the electronic device, wherein each corresponding actuation signal includes a plurality of formation actuation signals each present at an integer increment of a period corresponding to an actuation frequency having a maximum that is proportional to a distance of the corresponding additive source from the center of rotation,
   wherein each actuation signal includes null actuation events, wherein each corresponding additive source omits formation of the additive material on the wafer for each null actuation event provided to that additive source.

2. The method of claim 1, wherein the amount is a predetermined uniform quantum of the additive material.

3. The method of claim 2, wherein members of a proper subset of the formation actuation signals are spaced apart by a plurality of periods.

4. The method of claim 1, wherein a printing zone encompasses outputs of the plurality of additive sources, and the additive sources are evenly spaced apart from each other within the printing zone.

5. The method of claim 1, wherein the additive sources comprise drop-on-demand nozzles.

6. The method of claim 1, wherein the additive sources comprise photonic emitters.

7. The method of claim 1, further comprising distributing an additive material precursor onto a surface of the semiconductor wafer, wherein the additive material precursor is converted to the additive material by the additive sources.

8. The method of claim 7, wherein the distributing includes dispensing the additive material precursor onto a roller, and
transferring the additive material precursor from the roller to the semiconductor wafer surface.

9. The method of claim 1, wherein each additive source dispenses a fluid.

10. The method of claim 9, wherein the fluid comprises a liquid binding agent.

11. A method of forming an electronic device, comprising:
locating a semiconductor wafer adjacent additive sources distributed across a printing zone, the printing zone having a first end located adjacent a center of the wafer, and having a second end located opposite from the first end;
rotating the semiconductor wafer with respect to the additive sources, wherein the semiconductor wafer has a center of rotation; and
operating each additive source at integer multiples of an incremental period corresponding an actuation frequency having a maximum that is proportional to a distance of the additive source from the center of rotation to form an additive material in a layer of the electronic device over the wafer, the layer of the additive material being located within a patterned layer, the second end of the printing zone extending to a perimeter of the patterned layer, wherein:
the additive sources are first additive sources;
the printing zone is a first printing zone;
the actuation frequency is a first actuation frequency;
the layer is a first layer;
the additive material is a first additive material;
the patterned layer is a first patterned layer; and
further comprising:
rotating the wafer with respect to the first additive sources and second additive sources distributed across a second printing zone, the second printing zone having a first end located at the center of the wafer, and having a second end, the second end of the second printing zone being located opposite from the first end of the second printing zone; and
operating each second additive source at a second actuation frequency having a maximum that is proportional to a distance of the second additive source from the center of rotation to form a second additive material in a second layer of the electronic device on the wafer concurrently with forming the first layer, the second layer of the second additive material being located within a second patterned layer, the second end of the second printing zone extending to a perimeter of the second patterned layer.

12. The method of claim 11, wherein:
operating each additive source includes providing actuation signals at the actuation frequency to the additive source, the actuation signals including formation actuation signals, wherein the additive source forms a predetermined uniform amount of the additive material on the wafer for each formation actuation signal provided to the additive source; and
the actuation signals include null actuation signals, wherein the additive source omits formation of the additive material on the wafer for each null actuation signal provided to the additive source.

13. The method of claim 12, wherein members of a proper subset of the formation actuation signals are spaced apart by a plurality of periods.

14. The method of claim 11, wherein the additive material comprises silicon dioxide, silicon nitride, a metal, a polymer, or polycrystalline silicon.

15. The method of claim 11, wherein a printing zone encompasses outputs of the additive sources, and the additive sources are evenly spaced apart from each other within the printing zone.

16. The method of claim 11, wherein the additive sources comprise drop-on-demand nozzles.

17. The method of claim 11, wherein the additive sources comprise photonic emitters.

18. The method of claim 11, further comprising distributing an additive material precursor onto a surface of the semiconductor wafer, wherein the additive material precursor is converted to the additive material by the additive sources.

19. The method of claim 18, wherein the distributing includes dispensing the additive material precursor onto a roller, and
transferring the additive material precursor from the roller to the semiconductor wafer surface.

20. A method of forming an electronic device, comprising:
locating a semiconductor wafer adjacent additive sources distributed across a printing zone, the printing zone having a first end located adjacent a center of the wafer, and having a second end located opposite from the first end;
rotating the semiconductor wafer with respect to the additive sources, wherein the semiconductor wafer has a center of rotation; and
operating each additive source at integer multiples of an incremental period corresponding an actuation frequency having a maximum that is proportional to a distance of the additive source from the center of rotation to form an additive material in a layer of the electronic device over the wafer, the layer of the additive material being located within a patterned layer, the second end of the printing zone extending to a perimeter of the patterned layer,
wherein:
operating each additive source includes providing actuation signals at the actuation frequency to the additive source, the actuation signals including formation actuation signals, wherein the additive source forms a predetermined uniform amount of the additive material on the wafer for each formation actuation signal provided to the additive source; and
the actuation signals include null actuation signals, wherein the additive source omits formation of the additive material on the wafer for each null actuation signal provided to the additive source.

21. A method of forming an electronic device, comprising:
rotating a semiconductor wafer relative to a plurality of additive sources, the semiconductor wafer having an axis of rotation, each additive source configured to produce an amount of an additive material on the semiconductor wafer in response to a corresponding actuation signal; and directing towards each additive source the corresponding actuation signal, thereby forming over the semiconductor wafer an additive material layer that defines a feature of the electronic device at a plurality of locations arranged in a rectilinear array, each location defining an instance of the electronic at an intermediate stage of manufacturing.

22. The method of claim 21, wherein the electronic device is an integrated circuit.

23. The method of claim 21, wherein the electronic device includes a micro-electrical-mechanical device.

24. The method of claim 21, wherein the electronic device includes an optical device.

* * * * *